United States Patent
Weigold

(10) Patent No.: US 7,633,360 B2
(45) Date of Patent: Dec. 15, 2009

(54) MEMS RESONATOR HAVING AN INNER ELEMENT AND AN OUTER ELEMENT THAT FLEX

(75) Inventor: Jason W. Weigold, Somerville, MA (US)

(73) Assignee: Analog Devices, Inc., Norwood, MA (US)

(*) Notice: Subject to any disclaimer, the term of this patent is extended or adjusted under 35 U.S.C. 154(b) by 198 days.

(21) Appl. No.: 11/535,807

(22) Filed: Sep. 27, 2006

(65) Prior Publication Data

US 2007/0070821 A1 Mar. 29, 2007

Related U.S. Application Data

(60) Provisional application No. 60/720,733, filed on Sep. 27, 2005, provisional application No. 60/720,810, filed on Sep. 27, 2005.

(51) Int. Cl.
*H03H 9/24* (2006.01)
*H03H 9/46* (2006.01)
*H03H 9/50* (2006.01)
*H03B 5/30* (2006.01)

(52) U.S. Cl. .................... 333/186; 333/199; 331/154; 257/415

(58) Field of Classification Search ............... 333/186, 333/197, 199, 200
See application file for complete search history.

(56) References Cited

U.S. PATENT DOCUMENTS

| | | | |
|---|---|---|---|
| 5,798,283 A | 8/1998 | Montague et al. | |
| 5,963,788 A | 10/1999 | Barron et al. | |
| 6,136,630 A | 10/2000 | Weigold et al. | |
| 6,393,913 B1 * | 5/2002 | Dyck et al. | 73/504.12 |
| 6,429,755 B2 | 8/2002 | Speidell et al. | |
| 6,531,331 B1 | 3/2003 | Bennett et al. | |
| 6,894,576 B2 * | 5/2005 | Giousouf et al. | 331/154 |
| 6,894,586 B2 * | 5/2005 | Bircumshaw et al. | 333/133 |
| 6,909,221 B2 | 6/2005 | Ayazi et al. | |
| 6,985,051 B2 * | 1/2006 | Nguyen et al. | 333/186 |
| 7,023,065 B2 | 4/2006 | Ayazi et al. | |
| 7,098,757 B2 * | 8/2006 | Avazi et al. | 333/186 |
| 7,119,636 B2 * | 10/2006 | Nguyen et al. | 333/186 |
| 7,227,432 B2 * | 6/2007 | Lutz et al. | 333/186 |
| 7,248,131 B2 | 7/2007 | Fazzio et al. | |
| 7,295,088 B2 * | 11/2007 | Nguyen et al. | 333/186 |
| 7,319,372 B2 * | 1/2008 | Pan et al. | 333/197 |
| 7,323,952 B2 * | 1/2008 | Pan et al. | 333/186 |
| 2004/0065940 A1 | 4/2004 | Ayazi et al. | |
| 2007/0001783 A1 * | 1/2007 | Lutz et al. | 333/186 |
| 2007/0072327 A1 | 3/2007 | Weigold | |
| 2007/0103258 A1 * | 5/2007 | Weinstein et al. | 333/186 |

OTHER PUBLICATIONS

Single-Mask Reduced-Gap Capacitive Micromachined Devices; R. Abdolvand et al.; 18th IEEE Intnl. Conference on Micro Electro Mechanical Systems; Jan. 30-Feb. 3, 2005, pp. 151-154.

(Continued)

*Primary Examiner*—Barbara Summons
(74) *Attorney, Agent, or Firm*—Sunstein Kann Murphy & Timbers LLP

(57) ABSTRACT

A MEMS resonator has an outer element having an inner surface, the inner surface defining an area and a inner element coupled to the outer element and disposed within the area. The MEMS resonator also has an actuation electrode, in communication with the outer element, for generating electrostatic signals that cause the inner element to flex in a periodic manner.

12 Claims, 4 Drawing Sheets

OTHER PUBLICATIONS

SOI-Based HF and VHF Single-Crystal Silicon Resonators With Sub-100 Nanometer Vertical Capacitive Gaps, Siavash Pourkamali et al. The 12th International Conference on Solid State Sensors, Actuators and Microsystems, Boston, Jun. 8-12, 2003, vol. 1 pp. 837-840.

High-Q Single Crystal Silicon HARPSS Capacitive Beam Resonators With Self-Aligned Sub-100-nm Transduction Gaps, Siavash Pourkamali, et al. Journal of Microelectromechanical Systems, vol. 12, No. 4, Aug. 2003, pp. 487-496.

High Frequency Capacitive Micromechanical Resonators With Reduced Motional Resistance Using The HARPSS Technology, Siavash Pourkamali et al. 2004 Topical Meeting on Silicon Monolithic Integrated Circuits in RF Systems, Sep. 8-10, 2004, pp. 147-150.

VHF Single Crystal Silicon Capacitive Elliptic Bulk-Mode Disk Resonators—Part II: Implementation and Characterization, Siavash Pourkamali, et al. Journal of Microelectromechanical Systems, vol. 13, No. 6, Dec. 2004, pp. 1054-1062.

* cited by examiner

MEMS RESONATOR HAVING AN INNER ELEMENT AND AN OUTER ELEMENT THAT FLEX

CROSS-REFERENCE TO RELATED APPLICATIONS

This patent application claims priority under 35 U.S.C. § 119(e) to U.S. Provisional Patent Application No. 60/720,733 filed Sep. 27, 2005, entitled METHOD OF FORMING A MEMS RESONATOR and to U.S. Provisional Patent Application No. 60/720,810 filed Sep. 27, 2005, entitled MEMS RESONATOR, the disclosures of which are incorporated by reference herein in their entirety.

FIELD OF THE INVENTION

The invention generally relates to MEMS devices and, more particularly, the invention relates to MEMS resonators.

BACKGROUND OF THE INVENTION

Electronic clocking circuits are used in a wide variety of applications. For example, many solid state electronic devices (e.g., microprocessors) operate at a rate set by an internal or external clocking circuit. Accordingly, the accuracy of the clocking signal generated by a clocking circuit generally is critical to the proper operation of the underlying device being clocked. Many devices thus use conventional crystal oscillators to clock their underlying processes.

Crystal oscillators, however, have a number of drawbacks. For example, stable crystal oscillators typically are relatively large and expensive. Microelectromechanical systems (MEMS) resonators show promise in replacing crystal oscillators as well as filters such as Surface Acoustic Wave (SAW) and Bulk Acoustic Wave (BAW) filters used in communications devices. However, due to processing conditions, some MEMS resonators may be asymmetric, causing variation in resonator resonant frequency that may vary across a wafer or from different production lots.

SUMMARY OF THE INVENTION

In accordance with one aspect of the invention, a MEMS resonator includes an outer element having an inner surface, the inner surface defining an area and an inner element coupled to the outer element and disposed within the area. The resonator also includes an actuation electrode, in communication with one of the outer and inner elements, for generating electrostatic signals that cause the inner element and the outer element to flex in a periodic manner.

In accordance with related embodiments, the inner element or the outer element may be substantially toroidal shape. The outer element and the inner element may form two substantially concentric rings. The resonator may further include a detection electrode for detecting movement of the inner element, the outer element or both. The resonator may further include a set of detection electrodes and a set of actuation electrodes. The outer element may include an outer surface and the detection electrodes and the actuation electrodes may be substantially equally spaced around the outer surface of the outer element. The resonator may further include a beam coupled between the inner element and the outer element. The outer element and the inner element may be comprised of single crystal silicon.

In accordance with another aspect of the invention, a MEMS resonator includes a first element, a second element coupled to the first element, and an actuation electrode, in communication with one of the first and second elements, for generating electrostatic signals that cause the first element and the second element to flex in a periodic manner. The MEMS resonator also includes a detection electrode for detecting movement of the one of the first and second elements.

In accordance with related embodiments, the first element and the second element may be comprised of single crystal silicon. The actuation electrode may be comprised of polysilicon. The first element or the second element may be substantially toroidal shape. The first element and the second element may form two substantially concentric rings. The MEMS resonator may further include a set of detection electrodes and a set of actuation electrodes. The detection electrodes and the actuation electrodes may be substantially equally spaced around a surface of one of the elements. The method may further include a beam coupled between the first element and the second element.

In accordance with another aspect of the invention, a method of producing a clock signal includes providing a MEMS resonator having an outer element having an inner surface, the inner surface defining an area, and an inner element coupled to the outer element and disposed within the area, the MEMS resonator having a resonant frequency. The method further includes applying an actuation signal to the MEMS resonator via the outer element, the actuation signal having a frequency that is substantially equal to the resonant frequency of the MEMS resonator and detecting movement of the outer element to produce the clock signal.

In accordance with related embodiments, the inner element or the outer element may be substantially toroidal shape. The outer element and the inner element may form two substantially concentric rings.

BRIEF DESCRIPTION OF THE DRAWINGS

The foregoing advantages of the invention will be appreciated more fully from the following further description thereof with reference to the accompanying drawings wherein.

DESCRIPTION OF ILLUSTRATIVE EMBODIMENTS

In illustrative embodiments, a MEMS resonator includes an outer element and an inner element coupled to the outer element. The outer element, which is in communication with an actuation electrode for generating electrostatic signals that cause the inner element and the outer element to flex, is located between the inner element and the actuation electrode. The inner element may resonate at a prescribed resonant frequency upon receipt of a signal having that resonant frequency. Details of illustrative embodiments are discussed below.

Figure 1:
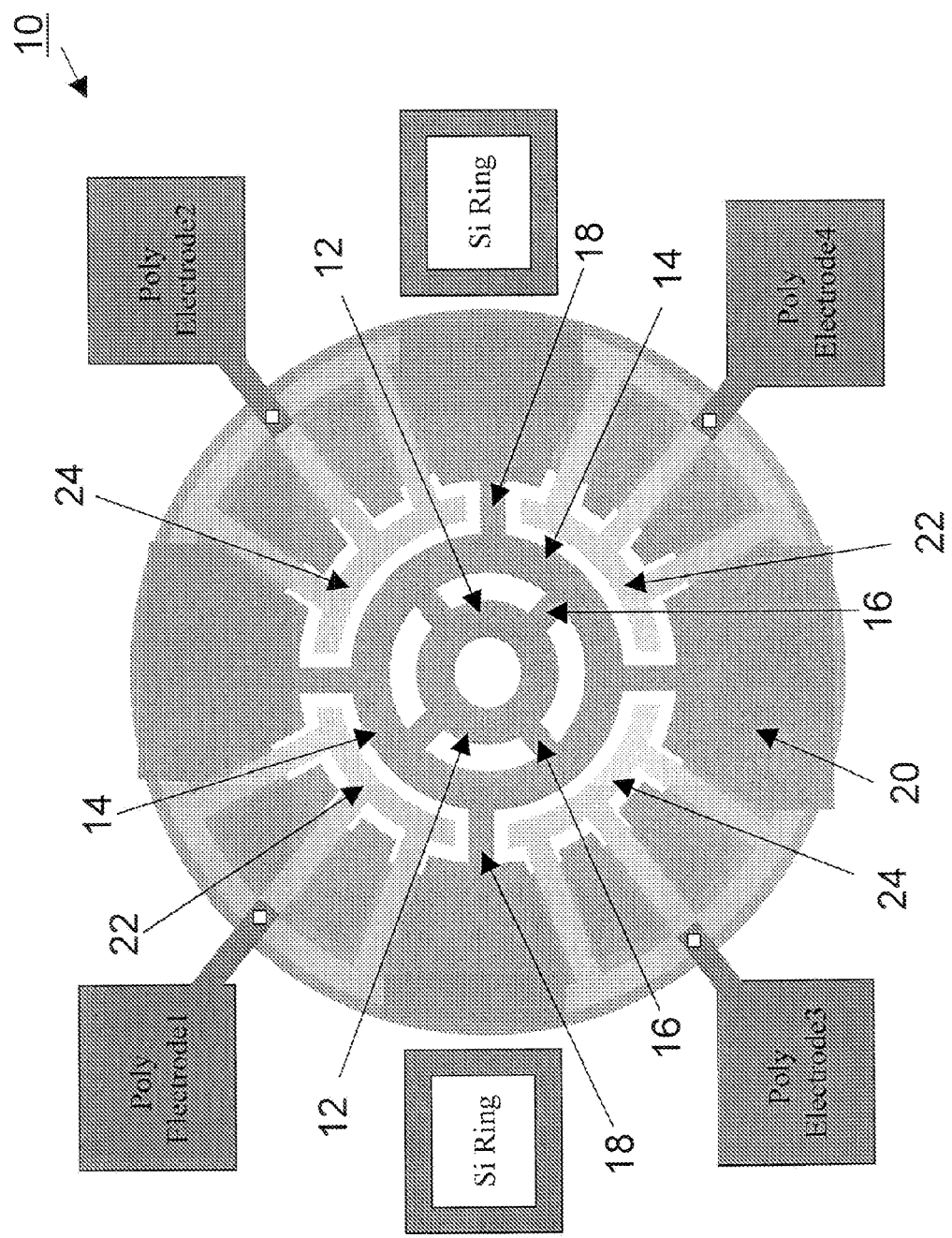
FIG. 1 schematically shows a plan view of a MEMS resonator produced in accordance with illustrative embodiments of the invention.
Figure 2:
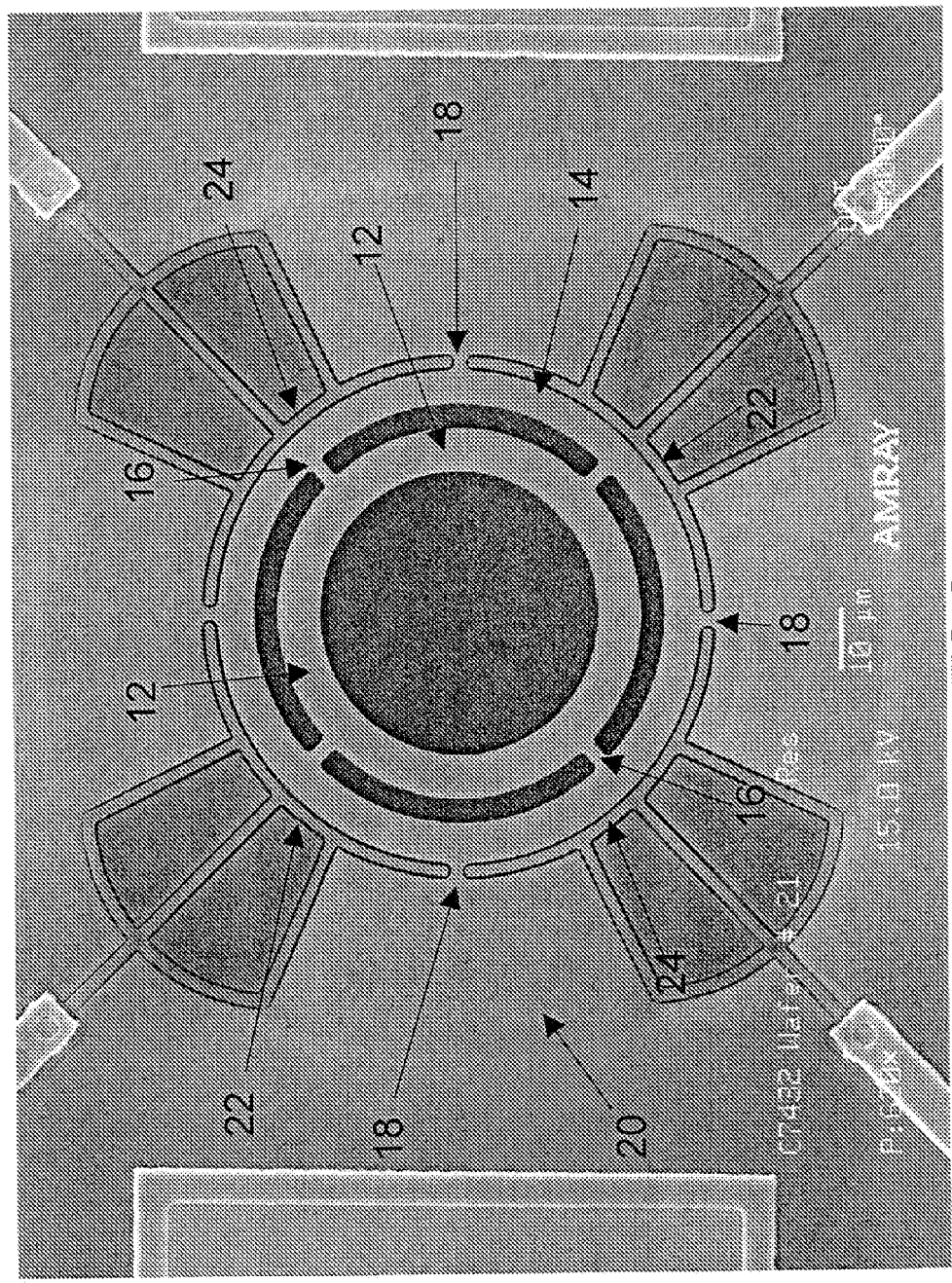
FIG. 2 shows a scanning electron micrograph of a MEMS resonator produced in accordance with illustrative embodiments of the invention.

FIG. 1 schematically shows a plan view and FIG. 2 shows a scanning electron micrograph of a resonator 10 configured in accordance with one embodiment of the present invention. The resonator 10 has an inner element 12 coupled with an outer element 14 by means of a plurality of beams 16. To provide symmetry, the plurality of beams 16 may be substantially equally spaced circumferentially about the inner element 12. For example, if there are four beams 16, the beams 16 may be about ninety degrees apart. A plurality of anchors 18 secure the outer element 14 to a substrate 20 to provide structural support. In a manner similar to the beams 16, the plurality of anchors 18 may be equally spaced about the outer element 14. Although FIGS. 1 and 2 show four beams 16 spaced around the inner element 12 and four anchors 18 spaced around the outer element 14, discussion of the specific locations and the number of beams 16 and/or anchors 18 is illustrative and not intended to limit the scope of the embodiments.

The resonator 10 also has a plurality of electrodes 22 and 24 to provide actuation and detection functionality to the outer element 14. More particularly, the plurality of electrodes 22 and 24 may include a first set of two actuation electrodes 22 for generating electrostatic signals that cause the outer element 14 and the inner element 12 to flex, and a second set of two detection electrodes 24 that detect the movement of the outer element 14. The four electrodes 22 and 24 illustratively are equally spaced about the outer element 14. Again, however, in a manner similar to the beams 16 and anchors 18, various embodiments may have different numbers, configurations and/or spacing of the electrodes 22 and 24.

Figure 3:
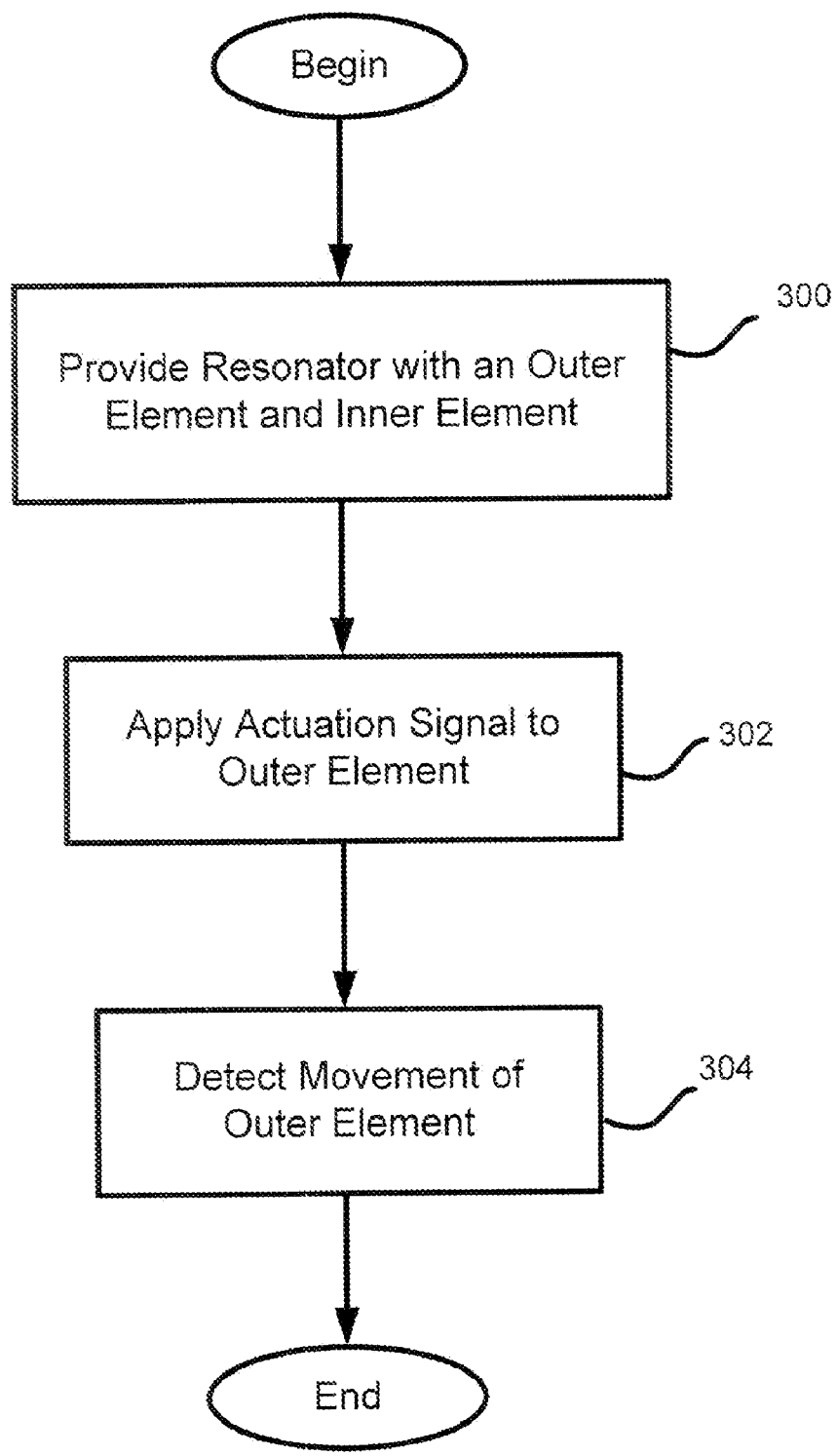
FIG. 3 shows a process of using a MEMS resonator produced in accordance with illustrative embodiments of the invention.

FIG. 3 shows a process of using the resonator 10 produced in accordance with one embodiment of the present invention. In step 300, the resonator 10 is provided with the outer element 14 and the inner element 12. The actuation electrodes 22 receive input signals and responsively generate electrostatic forces that are applied to the outer element 14 (step 302). For example, upon receipt of an input signal, the actuation electrodes 22 may generate positive forces (e.g., a positive potential). The outer element 14, which is disposed between the actuation electrodes 22 and the inner element 12, receives the positive electrostatic forces. The outer element 14, however, is configured to flex or deform more than the inner element 12, e.g., by decreasing the size and/or width of the outer element 14. Thus, one or more of the beams 16, which are typically aligned with the actuation electrodes 22 and the detection electrodes 24, push into the inner element 12. Portions of the inner element 12 consequently flex inwardly in response to receipt of the positive electrostatic forces by the outer element 14.

Figure 4:
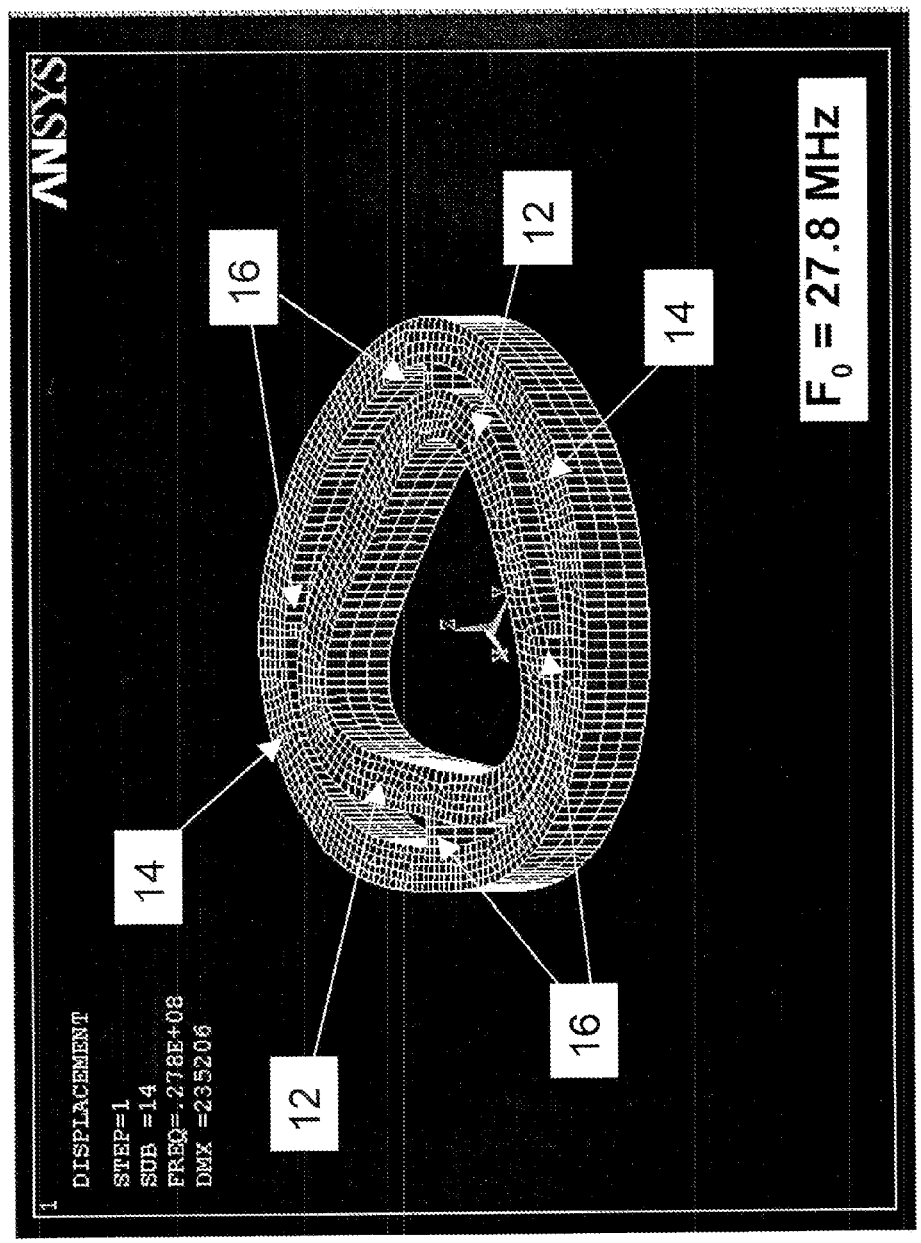
FIG. 4 schematically shows a simplified computer model of a portion of a MEMS resonator in use in accordance with illustrative embodiments of the invention.

Thus, in this example, the inner element 12 and the outer element 14 near the beams 16, which are near the actuation electrodes 22, flex inwardly together a similar amount or distance in this area. In response to this mechanical deformation, other parts of the inner element 12 may initially flex outwardly and toward the outer element 14. FIG. 4, for example, shows a simplified computer model of a flexing MEMS resonator 10, with some portions of the inner element 12 flexing away from the outer element 14 and some portions flexing toward the outer element 14. In alternative embodiments, bulk (compressional) modes may be used. In response to the inner element 12 movement, the outer element 14 subsequently flexes a similar amount in a similar manner since the outer element 14 is more pliable or bendable than the inner element 12.

After the actuation electrodes 22 generate the positive electrostatic force, the mechanical restorative forces of the inner element 12 may cause the inner element 12 (and thus the outer element 14) to flex outwardly at some points while other points may flex inwardly in a corresponding manner. For example, in cases where there are four beams 16 and two actuation electrodes 22, the two beams 16 near the actuation electrodes 22 exert the force on the inner element 12 while the other two beams 16 may act as nodes. In this case, the movement of the inner element 12 and the outer element 14 may occur somewhere between the node beams 16 and the beams 16 exerting the force.

The actuation electrodes 22 may continue to generate the noted forces in a periodic manner. When the inner element 12 receives signals (via the outer element 14) that have the same frequency as its resonant frequency, the inner element 12 typically resonates in response to those signals. Similarly, receipt of a signal not at the inner element 12 resonant frequency may have no more than a negligible effect on the inner element 12. In other words, receipt of such a signal should not cause the inner element 12 to resonate.

The outer element 14 also has a resonant frequency, which may be different than the inner element 12. However, since the outer element 14 is configured to flex or deform more than the inner element 12, receipt of signals at the outer element's resonant frequency should not significantly effect the outer element 14 or the inner element 12. This is because the inner element 12 is stiffer and less flexible, limiting the outer elements' 14 ability to deflect or deform. Thus, the resonant frequency of the inner element 12 dominates and determines the resonant frequency of the resonator 10.

The resonant frequency of the inner element 12 is a function of its geometry and material properties. Although the inner element 12 is shown in FIGS. 1 and 2 with a toroidal shape, any geometry may be used for the inner element 12 depending on the resonant frequency desired for the resonator 10. Similarly, the outer element 14 is also shown having a toroidal shape, but may have any geometry that suffices for the desired application. In addition, the shape of the inner element 12 may be substantially similar to the shape of the outer element 14, as shown, or may have a different shape. For example, the outer element 14 may be square shape and the inner element 12 may be toroidal shape.

Returning to the process, the detection electrodes 24 each form a variable capacitor with the outer element 14. As the outer element 14 moves relative to the detection electrodes 24, the capacitance between each detection electrode 24 and the outer element 14 changes because the distance between the effective capacitor plates changes as the outer element 14 (and also the inner element 12) flexes. In step 304, the detection electrodes, along with circuitry (not shown) coupled to the detection electrodes 24, may detect the movement of the outer element 14 and may convert any capacitance change into output signals that may be further processed. For example, the output signal may be a clock signal that essentially is a periodic signal filtered from a plurality of signals having different frequencies. Thus, the resonator 10 may be used to filter a desired signal from an input signal having interfering signals at other frequencies. To this end, additional conventional circuitry may be used to amplify the resonator output signal and use the output signal as an input signal to the actuation electrodes 22. As another example, the output signal may be a clock signal that acts as a clock within a computer system.

The resonator 10 illustratively is a MEMS resonator. Thus, MEMS processes used to fabricate the resonator 10 may involve thin film deposition, photolithography and etching techniques that are well known to those skilled in the art. Details of one process of forming a MEMS resonator on a wafer with integrated circuits are discussed in co-pending U.S. patent application entitled, "METHOD OF FORMING AN INTEGRATED MEMS RESONATOR," filed on the same day herein, also naming Jason W. Weigold as inventor, the disclosure of which is incorporated herein, in its entirety, by reference. Consequently, resonator 10 may be produced by conventional MEMS techniques or with circuitry as discussed in the above co-pending patent application.

Embodiments of the present invention allow the inner element 12 to be processed in such a way that its shape may be substantially symmetric and repeatably consistent across a wafer or from one production lot to the next. Specifically, both the inner surface and the outer surface of the inner element 12 may be processed in one processing step, e.g., using one photolithography mask and subsequent etching step. For example, during processing, one processing step may form the outer surface of the outer element 14 while another processing step forms the inner surface of the outer element 14. Due to misalignments of the partially formed structure on the wafer and the photolithography mask used to subsequently process the wafer, the outer element 14 may not be symmetrical. For example, if the outer element 14 is toroidal shape, one side of the structure (e.g., 3 o'clock position) may be thicker than another side (e.g., 9 o'clock position) and both sides may be different than the other sides (e.g., 12 and 6 o'clock positions). In cases where there is no second resonating element 12 and the outer element 14 is used as the only flexing or resonating element, the resonator may have unacceptable variations in its structure for use as a clock or filter.

In contrast, in illustrative embodiments, one processing step may form the outer surface of the outer element 14 while another processing step may form the inner surface of the outer element 14 along with both the outer and inner surfaces of the inner element 12. In this case, errors due to mask and substrate misalignment are substantially eliminated for the inner element 12. The inner element 12, therefore, should be substantially symmetrical, limited only by the mask geometries and substrate processing variations. Accordingly, since the inner element 12 is the dominant flexing, resonating element and determines the resonant frequency of the resonator 10 rather than the outer element 14, various embodiments using this process should produce a high quality factor or Q factor resonator.

Those skilled in the art should understand that other embodiments may have a number of different features. For example, the shape and number of the actuation and detection electrodes 22, 24 may vary. For instance, if the outer element 14 is square shape, the actuation and detection electrodes 22, 24 may be straight. Similarly, there may be only one actuation electrode 22 and one detection electrode 24, or the same electrode may be used for both the actuation and the detection functionality. In this case, the electrode(s) may be positioned along one or more sides of the outer element 14, rather than surrounding it. The configuration of the actuation and detection electrodes 22, 24 may also vary. For example, the actuation and detection electrodes 22, 24 may be positioned adjacent to the inner element 12 rather than the outer element 14. In this case, the inner element 12 may be configured to flex or deform more than the outer element 14, which would dominate the resonant frequency of the resonator 10. Actuation electrodes 22 and/or detection electrodes 24 may be provided adjacent to both the outer element 14 and the inner element 12. The configuration of the two flexing elements 12, 14 may also vary. For example, the one element 12 may be adjacent to the other element 14 rather than located within the other element 14 (e.g., outer surface of one element 12 coupled with the outer surface of the other element 14 with one or more beams 16). In this case, the actuation electrode(s) 22 and the detection electrode(s) 24 actuate and detect motion of the same element, element 12 or element 14 or both elements 12 and 14. Although two flexing elements 12, 14 have been discussed herein, more than two flexing elements may be used in various embodiments of the present invention.

Although the above discussion discloses various exemplary embodiments of the invention, it should be apparent that those skilled in the art can make various modifications that will achieve some of the advantages of the invention without departing from the true scope of the invention.

What is claimed is:

1. A MEMS resonator comprising:
   an outer element having an inner surface, the inner surface defining an area;
   an inner element coupled to the outer element and disposed within the area; and
   an actuation electrode, in communication with only one of the outer and inner elements, for generating electrostatic signals that cause the inner element and the outer element to flex in a periodic manner.

2. The MEMS resonator of claim 1, wherein the inner element is substantially toroidal shape.

3. The MEMS resonator of claim 1, wherein the outer element is substantially toroidal shape.

4. The MEMS resonator of claim 1, wherein the outer element and the inner element form two substantially concentric rings.

5. The MEMS resonator of claim 1, further comprising a detection electrode for detecting movement of the inner element, the outer element, or both.

6. A MEMS resonator comprising:
   an outer element having an outer surface and an inner surface, the inner surface defining an area;
   an inner element coupled to the outer element and disposed within the area;
   at least one actuation electrode, in communication with one of the outer and inner elements, for generating electrostatic signals that cause the inner element and the outer element to flex in a periodic manner; and
   at least one detection electrode for detecting movement of the inner element, the outer element, or both wherein the at least one detection electrode and the at least one actuation electrode are substantially equally spaced around the outer surface of the outer element.

7. A MEMS resonator comprising:
   an outer element having an inner surface, the inner surface defining an area;
   an inner element coupled to the outer element and disposed within the area;
   an actuation electrode, in communication with one of the outer and inner elements, for generating electrostatic signals that cause the inner element and the outer element to flex in a periodic manner; and
   a beam coupled between the inner element and the outer element.

8. The MEMS resonator of claim 1, wherein the outer element and the inner element are comprised of single crystal silicon.

9. A method of producing a clock signal, the method comprising:
   providing a MEMS resonator having an outer element having an inner surface, the inner surface defining an area and an inner element coupled to the outer element and disposed within the area, the MEMS resonator having a resonant frequency;

applying an actuation signal to the MEMS resonator via the outer element, the actuation signal having a frequency that is substantially equal to the resonant frequency of the MEMS resonator; and detecting movement of the outer element to produce the clock signal.

10. The method of claim 9, wherein the inner element is substantially toroidal shape.

11. The method of claim 9, wherein the outer element is substantially toroidal shape.

12. The method of claim 9, wherein the outer element and the inner element form two substantially concentric rings.

* * * * *

UNITED STATES PATENT AND TRADEMARK OFFICE
CERTIFICATE OF CORRECTION

PATENT NO. : 7,633,360 B2
APPLICATION NO. : 11/535807
DATED : December 15, 2009
INVENTOR(S) : Jason W. Weigold Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 277 days.

Signed and Sealed this

Ninth Day of November, 2010

David J. Kappos
*Director of the United States Patent and Trademark Office*